United States Patent
Radinski et al.

(10) Patent No.: US 9,952,981 B2
(45) Date of Patent: Apr. 24, 2018

(54) READ CACHE MANAGEMENT IN MULTI-LEVEL CELL (MLC) NON-VOLATILE MEMORY

(71) Applicant: APPLE INC., Cupertino, CA (US)

(72) Inventors: Alex Radinski, Hadera (IL); Tsafrir Kamelo, Rishon Lezion (IL)

(73) Assignee: APPLE INC., Cupertino, CA (US)

( * ) Notice: Subject to any disclaimer, the term of this patent is extended or adjusted under 35 U.S.C. 154(b) by 122 days.

(21) Appl. No.: 14/499,286

(22) Filed: Sep. 29, 2014

(65) Prior Publication Data

US 2016/0092372 A1   Mar. 31, 2016

(51) Int. Cl.
*G06F 12/00* (2006.01)
*G06F 12/121* (2016.01)
*G06F 12/0868* (2016.01)
*G11C 11/56* (2006.01)

(52) U.S. Cl.
CPC ........ *G06F 12/121* (2013.01); *G06F 12/0868* (2013.01); *G06F 2212/1021* (2013.01); *G06F 2212/1024* (2013.01); *G06F 2212/1028* (2013.01); *G06F 2212/214* (2013.01); *G06F 2212/312* (2013.01); *G11C 11/5642* (2013.01); *G11C 2211/5641* (2013.01); *Y02B 60/1225* (2013.01)

(58) Field of Classification Search
CPC .. G06F 12/121; G06F 12/127; G06F 12/0804; G06F 12/0246; G06F 12/123; G06F 12/0862
See application file for complete search history.

(56) References Cited

U.S. PATENT DOCUMENTS

| 8,310,876 B2 | 11/2012 | Yoo et al. | |
| 8,520,442 B2 | 8/2013 | Yoon | |
| 2007/0198779 A1* | 8/2007 | Wang | G06F 12/123 711/136 |
| 2010/0235579 A1* | 9/2010 | Biles | G06F 12/127 711/125 |
| 2011/0055458 A1* | 3/2011 | Kuehne | G06F 12/0246 711/103 |
| 2011/0280069 A1* | 11/2011 | Patapoutian | G11C 11/5642 365/185.03 |
| 2012/0096225 A1* | 4/2012 | Khawand | G06F 12/0848 711/119 |
| 2013/0080858 A1* | 3/2013 | Lee | G11C 16/349 714/773 |
| 2013/0170296 A1 | 7/2013 | Yun | |
| 2013/0326116 A1* | 12/2013 | Goss | G06F 12/0871 711/103 |

(Continued)

*Primary Examiner* — Ryan Bertram
*Assistant Examiner* — Trang K Ta
(74) *Attorney, Agent, or Firm* — D. Kligler IP Services Ltd.

(57) ABSTRACT

A method includes reading memory pages from a non-volatile memory that holds at least first memory pages having a first bit significance and second memory pages having a second bit significance, different from the first bit significance. At least some of the read memory pages are cached in a cache memory. One or more of the cached memory pages are selected for eviction from the cache memory, in accordance with a selection criterion that gives eviction preference to the memory pages of the second bit significance over the memory pages of the first bit significance. The selected memory pages are evicted from the cache memory.

20 Claims, 3 Drawing Sheets

(56) References Cited

U.S. PATENT DOCUMENTS

| | | | |
|---|---|---|---|
| 2014/0229699 A1* | 8/2014 | Gurgi | G06F 13/1626 |
| | | | 711/167 |
| 2015/0193302 A1* | 7/2015 | Hyun | G11C 29/52 |
| | | | 714/764 |
| 2015/0234708 A1* | 8/2015 | Storm | G06F 11/1076 |
| | | | 714/6.22 |
| 2015/0364191 A1* | 12/2015 | Muralimanohar | G11C 16/26 |
| | | | 365/163 |
| 2017/0068622 A1* | 3/2017 | Chang | G06F 12/0862 |

* cited by examiner

READ CACHE MANAGEMENT IN MULTI-LEVEL CELL (MLC) NON-VOLATILE MEMORY

TECHNICAL FIELD

The present disclosure relates generally to non-volatile memory, and particularly to methods and systems for memory management.

SUMMARY

An embodiment that is described herein provides a method including reading memory pages from a non-volatile memory that holds at least first memory pages having a first bit significance and second memory pages having a second bit significance, different from the first bit significance. At least some of the read memory pages are cached in a cache memory. One or more of the cached memory pages are selected for eviction from the cache memory, in accordance with a selection criterion that gives eviction preference to the memory pages of the second bit significance over the memory pages of the first bit significance. The selected memory pages are evicted from the cache memory.

In some embodiments, the non-volatile memory includes a 2-bit multi-level cell (MLC) Flash memory, the first memory pages include least significant bit (LSB) data pages, and the second memory pages include most significant bit (MSB) data pages. In other embodiments, the non-volatile memory includes a triple-level cell (TLC) Flash memory, the first memory pages include least significant bit (LSB) data pages or middle significant bit (MSB) data pages, and the second memory pages include the middle significant bit data pages or upper significant bit (USB) data pages.

In an embodiment, caching the memory pages includes caching information indicative of respective bit significance orders of the cached memory pages, and selecting the memory pages for eviction includes evaluating the selection criterion using the cached information.

In a disclosed embodiment, a given second memory page is decoded by: if the cache memory caches a given first memory page that was stored in the non-volatile memory in a same group of memory cells as the given second memory page, decoding the given second memory page using the cached given first memory page; and, if the cache memory does not cache the given first memory page, decoding the given second memory page irrespective of the given first memory page.

In an example embodiment, caching the memory pages includes caching information indicative of respective groups of memory cells of the non-volatile memory from which the cached memory pages were read, and decoding the given second memory page includes deciding, using the information, whether or not the cache memory caches the given first memory page. In another example embodiment, decoding the given second memory page includes distinguishing, using the given first memory page, between at least first and second subsets of the given second memory page that were decoded relative to respective first and second read thresholds.

Decoding the given second memory page may include counting first and second error events relating to the first and second read thresholds, respectively, and adjusting the first and second read thresholds responsively to the counted first and second error events. In another embodiment, decoding the given second memory page includes assigning soft decoding metrics to bits of the given second memory page depending on the bits of the given first memory page, and decoding the given second memory page using the soft decoding metrics.

There is also provided, in accordance with an embodiment that is described herein, an apparatus including a cache memory and a processor. The processor is configured to read memory pages from a non-volatile memory that holds at least first memory pages having a first bit significance and second memory pages having a second bit significance, different from the first bit significance, to cache at least some of the read memory pages in the cache memory, to select one or more of the cached memory pages for eviction from the cache memory in accordance with a selection criterion that gives eviction preference to the memory pages of the second bit significance over the memory pages of the first bit significance, and to evict the selected memory pages from the cache memory.

There is also provided, in accordance with an embodiment that is described herein, apparatus including a non-volatile memory, a cache memory and a processor. The non-volatile memory is configured to hold at least first memory pages having a first bit significance and second memory pages having a second bit significance, different from the first bit significance. The processor is configured to read memory pages from the non-volatile memory, to cache at least some of the read memory pages in the cache memory, to select one or more of the cached memory pages for eviction from the cache memory in accordance with a selection criterion that gives eviction preference to the memory pages of the second bit significance over the memory pages of the first bit significance, and to evict the selected memory pages from the cache memory.

The present disclosure will be more fully understood from the following detailed description of the embodiments thereof, taken together with the drawings in which:

DETAILED DESCRIPTION OF EMBODIMENTS

Overview

Embodiments that are described herein provide methods and systems for cache management in memory controllers that control Multi-Level Cell (MLC) Non-Volatile Memory (NVM) devices. In the disclosed techniques, a memory controller comprises a cache memory for caching memory pages that have been read from the MLC NVM. The cached memory pages are each associated with a certain bit significance. In some embodiments, the memory controller selects memory pages for eviction from the cache memory based on an eviction criterion that gives preference to eviction of memory pages of high bit significance, and tends to retain memory pages of low bit significance in the cache memory.

For example, in a four-level, two bits/cell MLC, the memory controller typically gives preference to eviction of Most Significant Bit (MSB) pages, such that Least Significant Bit (LSB) pages are more likely to be retained in the cache memory.

Cache eviction criteria of this sort are advantageous for a number of reasons. For example, in some embodiments the memory controller is able to decode an MSB page with improved performance if the corresponding LSB page (read from the same group of memory cells) is available. If the corresponding LSB page is not available, the MSB page is still decodable, but possibly with lower performance. When using the disclosed cache management scheme, the likelihood of finding the corresponding LSB page in the cache memory is increased.

Thus, in some embodiments the memory controller carries out an opportunistic MSB decoding process: When preparing to decode a given MSB page, the memory controller checks whether the corresponding LSB page is cached in the cache memory. If so, the memory controller decodes the MSB page with the assistance of the LSB page. If not, the memory controller decodes the MSB page irrespective of the LSB page. This opportunistic process, which is enhanced by the disclosed cache eviction criterion, improves the average MSB page decoding performance without incurring additional LSB read operations.

System Description

Figure 1:
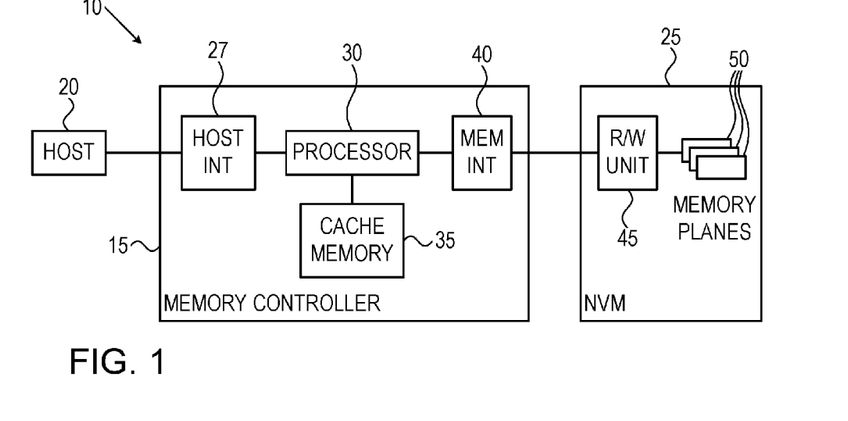
FIG. 1 is a block diagram that schematically illustrates a non-volatile memory system, in accordance with an embodiment that is described herein.

FIG. 1 is a block diagram that schematically illustrates a non-volatile memory system 10, in accordance with an embodiment that is described herein. System 10 can be used in various host systems and devices, such as in computing devices, cellular phones and smartphones, other communication terminals, removable memory modules (sometimes referred to as "USB Flash Drives"), Solid State Drives (SSD), digital cameras, music and other media players and/or any other system or device in which data is stored and retrieved.

In system 10, a host 20 communicates with a memory controller 15. The memory controller reads and stores data for the host in a non-volatile memory (NVM) 25, typically a Multi-Level Cell (MLC) Flash memory. Memory controller 15 comprises a host interface 27 for communicating with the host, a memory interface 40 for communicating with NVM 25, and a processor 30 that carries out the functions described herein.

Processor 30 reads memory pages stored on NVM 25 and caches some of the read memory pages in a cache memory 35. Moreover, processor 30 manages the memory pages stored in cache memory 35 in accordance with embodiments to be described later. In the description that follows, the terms "memory page," "page" and "data page" are used interchangeably. NVM 25 comprises a read/write (R/W) unit 45, which is configured to read and write data pages to one or more memory devices 50, respectively. Each memory device 50 typically comprises a MLC Flash device, e.g., two-, three- or four-bits/cell MLC, or any other suitable MLC type.

The exemplary configuration of system 10 as shown in FIG. 1 is shown purely for the sake of conceptual clarity and not by way of limitation of the embodiments described herein. Any other suitable memory system configuration can also be used to describe the embodiments described herein. Elements that are not necessary for understanding of the disclosed techniques, such as various interfaces, addressing circuits, timing and sequencing circuits and debugging circuits, have been omitted from the figure for clarity.

Memory controller 15, and in particular processor 30, may be implemented in hardware. Alternatively, the memory controller may comprise a microprocessor that runs suitable software, or a combination of hardware and software elements. Although the example of FIG. 1 shows NVM 25 with memory devices 50 as a single memory die, system 10 may comprise multiple memory dies that are controlled by memory controller 15. In the exemplary system configuration shown in FIG. 1, NVM 25 and memory controller 15 are implemented as two separate Integrated Circuits (ICs). In alternative embodiments, however, the memory die and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory planes are disposed. Further alternatively, some or all of the functionality of memory controller 15 can be implemented in software and carried out by a processor or other element of host 20. In some embodiments, host 20 and memory controller 15 may be fabricated on the same die, or on separate dies in the same device package.

In some embodiments, processor 30 of memory controller 15 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Each memory device 50 may comprise one or more memory planes, which further comprise multiple physical memory blocks. Each memory block comprises a respective array of non-volatile memory cells. In the present example the memory cells comprise Flash cells. The memory cells store data as analog voltages and may comprise analog cells of any kind, such as, for example, NAND, NOR and Charge Trap Flash (CTF) cells, phase change RAM (PRAM, also referred to phase change memory—PCM), Nitride Read Only Memory (NROM), Ferroelectric RAM (FRAM), magnetic RAM (MRAM) and/or Dynamic RAM (DRAM) cells.

Data is stored on each of the memory cells, typically a floating gate transistor device, by changing the stored analog voltage, typically the threshold voltage of the floating gate transistor. In single level cell (SLC) flash memory, one bit of data is stored per memory cell. Multi-level (MLC) flash memory refers to storage at a density of 2 or more bits of data are memory cell. Triple-level cell (TLC) refers to data storage with a density of 3 bits of data per memory cell.

The floating gate transistor devices, assumed herein to be NAND transistor devices, are typically arranged in multiple rows and columns in the memory blocks. The floating gates of the NAND transistor devices in the array are connected by rows associated with respective word lines. The sources of the NAND devices are typically connected along columns associated with respective bit lines.

The memory array is typically divided into multiple pages, i.e., groups of memory cells that are programmed or read simultaneously. In some embodiments, each page comprises an entire row (word line) of the array. In other embodiments, each row can be divided into two or more pages.

Figure 2:
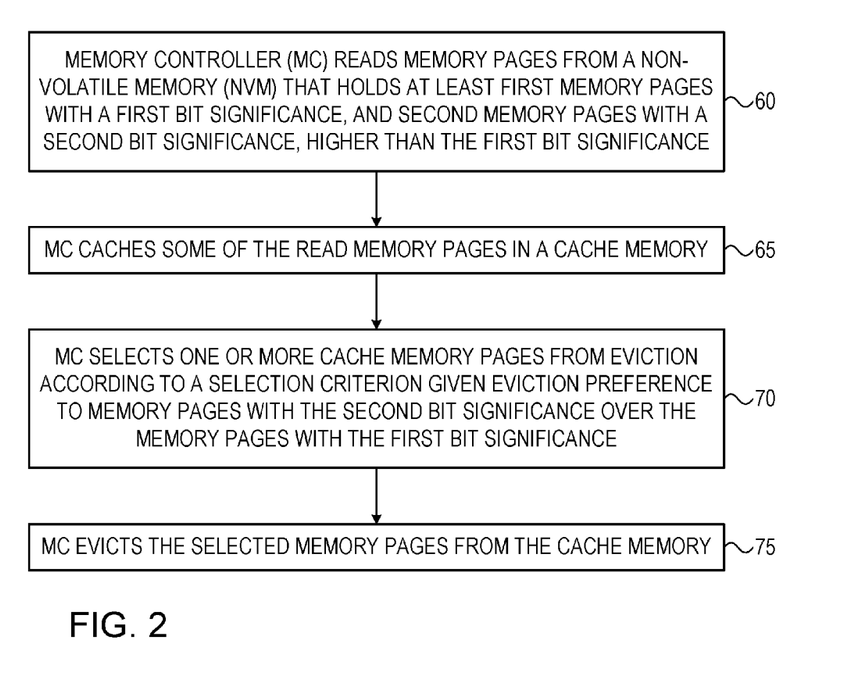
FIG. 2 is a diagram illustrating a threshold voltage distribution in non-volatile memory cells, in accordance with an embodiment that is described herein.

FIG. 2 is a diagram illustrating multiple threshold voltage distributions 100 in a group of non-volatile memory cells of memory devices 50, in accordance with an embodiment that is described herein. The four threshold voltage ($V_{TH}$) distributions correspond to the four possible 2-bit data values stored in the memory cells. For example, when $V_{TH}$ of a given memory cell is within a distribution 105, the 2-bit data value stored in the given memory cell is "11".

Similarly, when $V_{TH}$ is within distributions 110, 120, and 125, the stored 2-bit data is "01", "00", and "10", respectively. The most significant bit (MSB) and the least significant bit (LSB) of the stored 2-bit data values are shown within rectangles 127 and 129, respectively. The threshold voltage distributions of FIG. 2 are depicted purely by way of example, and any other suitable mapping of bit values to programming levels can be used in alternative embodiments. $V_{TH}$ distributions 100 are also referred to as programming levels.

When processor 30 reads data stored in LSB or MSB pages in NVM 25, R/W unit 45 sets a specific read threshold voltage $R_{TH}$ on the word lines so as to distinguish between the various programming levels. For reading an LSB page, for example, the R/W unit sets an LSB read threshold voltage denoted LSB $R_{TH}$, as shown in FIG. 2 at a marker 135. For reading an MSB page, the R/W unit sets two read thresholds denoted as MSB $R_{TH1}$ and MSB $R_{TH2}$, shown respectively markers 130 and 140. The $V_{TH}$ of memory cells for which MSB="0" will fall between MSB $R_{TH1}$ and MSB $R_{TH2}$. The $V_{TH}$ of memory cells for which MSB="1" will fall either below MSB $R_{TH1}$ or above MSB $R_{TH2}$.

The above example refers to four-level MLC. As another example, for eight-level (3 bits/cell) TLC Flash memory, there are typically eight threshold voltage distributions, representing three pages, which are read using seven read thresholds. The three data page types for TLC are sometimes denoted LSB page, middle significant bit (MSB) page, and upper significant bit (USB) page.

The page types described above are also referred to as pages with different "bit significance," with MSB pages having a higher bit significance than the LSB pages for 2-bit MLC non-volatile memory. Similarly for TLC non-volatile memory, a USB memory page has a higher bit significance than MSB and LSB memory pages.

In some embodiments, processor 30 encodes the data of each page with an error correction code (ECC), such as a low density parity check (LDPC) or Bose-Chaudhuri-Hocquenghem (BCH) code, and decodes the ECC upon readout to fix read errors. For example, if the actual stored data is LSB="1" and $V_{TH}$ lies within distribution 110, but is too close to LSB $R_{TH}$, LSB="0" may be read. This error is referred to as a "bit flip" from "1" → "0" and denoted in FIG. 2 as BF10 at marker 135. Similarly, if the actual data is LSB="0" and $V_{TH}$ lies within distribution 120, but is too close to LSBR$_{TH}$, LSB="1" may be read. This "bit flip" from "0" → "1" is denoted in FIG. 2 as BF01 at marker 135. The error correction codes described above can be used to correct bit flips. Similar bit flips in the vicinity of the two MSB thresholds are also shown in the figure.

If a bit flip error occurs in the MSB data pages, in addition to using the ECC codes to correct the error, the LSB data pages from the same group of memory cells can assist in correcting the bit flips. For example, if MSB bit flip BF10 occurs and the LSB data for the same memory cell (or the same group of memory cells) was known to be LSB="0", then the bit flip occurred at marker 140 and not marker 130. Similarly, if LSB="1", then bit flip BF10 occurred at marker 130.

In other words, processor 30 can use the LSB data stored in cache memory 35 to distinguish between bit flips in the MSB data pages that occur at marker 130 (MSB $R_{TH1}$) and bit flips that occur at marker 140 (MSB $R_{TH2}$). This differentiation enables the processor to adjust each of the MSB read thresholds separately. For example, for a given MSB threshold (either MSB $R_{TH1}$ or MSB $R_{TH2}$) the processor may assess the difference between the number of BF10 events and the number of BF01 events, and adjust that MSB threshold so as to reduce the difference.

Additionally or alternatively, processor 30 may improve the MSB decoding performance by assigning soft decoding metrics to the MSB bits based on the LSB data. For example, processor may encode the MSB data with an ECC that is decoded using soft decoding metrics, e.g., Log Likelihood Ratios (LLRs). The processor may assign LLRs to MSB bits based on the corresponding LSB bits. In an example embodiment, the processor may set or adjust the LLRs of a given MSB bit depending on whether the corresponding LSB bit is "1" or "0" (equivalently, depending on whether the MSB bit was decoded around MSB $R_{TH1}$ or MSB $R_{TH2}$).

In summary, the decoding performance of a given MSB page can be improved by using the decoded data of the corresponding LSB page (i.e., the LSB page read from the same group of memory cells), if available. A similar relationship exists in TLC memory, as well as in other types of multi-level cell memory. As will be explained below, in some embodiments processor 30 carries out a cache management scheme that enables efficient use of this relationship.

Cache Memory Management for Retaining Lower Bit Significance Data Pages

In some embodiments, processor 30 caches memory pages that are read from devices 50 in cache memory 35. This cache memory typically resides in a volatile memory (e.g., Dynamic Random Access Memory—DRAM) of the memory controller. Caching of read pages has many advantages, including reduction of access time to frequently-accessed pages.

Since cache memory 35 has a finite size, processor 30 typically evicts memory pages from the cache memory in accordance with some predefined eviction criterion. The eviction criterion may aim, for example, to evict rarely-used pages and retain frequently-accessed pages in the cache.

In some embodiments, the eviction criterion used by processor 30 depends on the bit significance of the cached pages, possibly in combination with other factors. In some embodiments, the eviction criterion gives preference to eviction of higher-bit-significance pages over lower-bit-significance pages. In four-level MLC, for example, the criterion gives preference to eviction of MSB pages, and aims to retain LSB pages in the cache.

By using such an eviction criterion, processor 30 increases the likelihood that, when reading a given MSB page, its corresponding LSB page will be found in cache memory 35. If the corresponding LSB page is indeed found in the cache memory, that LSB page can be used for improving the decoding performance of the MSB page, without having to read the LSB page from NVM 25. This statistical, opportunistic approach increases decoding performance while incurring little or no additional latency and power consumption.

Figure 3:
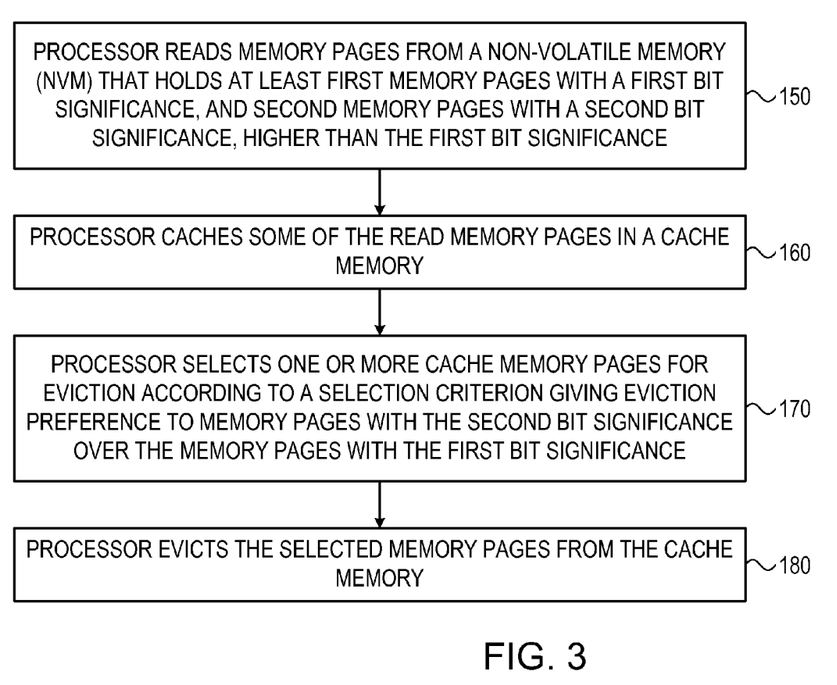
FIG. 3 is a flow chart that schematically illustrates a method for cache memory management, in accordance with an embodiment that is described herein.

FIG. 3 is a flow chart that schematically illustrates a method for cache memory management, in accordance with an embodiment that is described herein. In a reading step 150, processor 30 reads memory pages from non-volatile memory 25 that holds at least first memory pages (e.g., LSB pages) with a first bit significance, and second memory pages (e.g., MSB pages) with a second bit significance, higher than the first bit significance. In a caching step 160, processor 30 caches some of the read memory pages in cache memory 35.

In a selecting step 170, processor 30 selects one or more of the cached memory pages for eviction according to a selection criterion giving eviction preference to memory pages with the second bit significance over the memory pages with the first bit significance. In an evicting step 180, processor 30 evicts the selected memory pages (e.g., the MSB pages) from cache memory 35, so as to release more storage space in cache memory 35 for more cached LSB data pages.

In some embodiments, processor 30 stores in the cache memory information that is indicative of the bit significance order of each cached page (e.g., whether the page is an LSB page or an MSB page). The processor later uses this information in evaluating the eviction criterion. In an example embodiment, the information may comprise the memory address of the page in NVM 25, which is in turn indicative of the bit significance. Alternatively, any other suitable information or indication can be used.

In some embodiments, processor 30 reads and caches data pages sequentially in step 160. To increase the likelihood of finding the LSB page for decoding the MSB pages stored in the same group of memory cells, processor 30 may assign eviction preference to the oldest cached memory pages in selection step 170.

Figure 4:
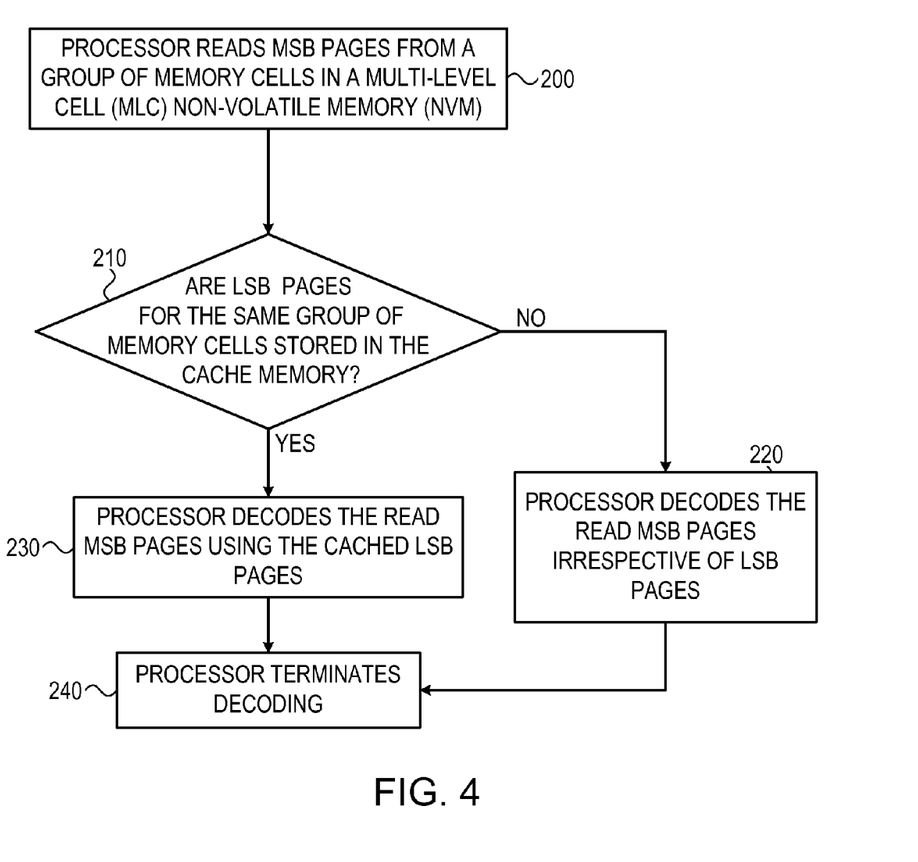
FIG. 4 is a flow chart that schematically illustrates a method for improving data decoding, in accordance with an embodiment that is described herein.

Improving Decoding Using Lower Bit Significance Data Pages Stored in the Cache Memory FIG. 4 is a flow chart that schematically illustrates a method for improving data decoding after read operations, in accordance with an embodiment that is described herein. In a reading step 200, processor 30 reads an MSB page from a group of memory cells in multi-level cell (MLC) non-volatile memory (NVM) (e.g., NVM 25). In a decision step 210, processor 30 assesses if the LSB page from the same group of memory cells is currently cached in cache memory 35. If not, processor 30 decodes the read MSB page irrespective of the LSB page, at a first decoding step 220. If the corresponding LSB page is found in the cache memory, processor 30 decodes the read MSB page using the cached LSB page, at a second decoding step 230. At a terminating step 240, processor 30 terminates decoding.

In order to carry out the method of FIG. 4, processor 30 may use any suitable mechanism for associating between LSB pages and corresponding MSB pages. For example, the processor may cache, for each cached page, the page's memory address in NVM 25 or any other suitable indication that enables the processor to decide whether a given LSB page and a given MSB page were read from the same group of memory cells or not.

In some embodiments, each word line (row) in the array of memory cells as described previously has a different optimal read threshold voltage (e.g., LSB $R_{TH}$, MSB $R_{TH1}$, and MSB $R_{TH2}$). The optimal read threshold voltages often follow a trend from one word line to the next, a trend that can be predicted and modeled, particularly when reading the data from adjacent word lines sequentially.

For example, suppose the optimal value of LSB $R_{TH}$ on a first word line is 2.5 V, the second word line 2.52 V, the third 2.55 V, and the fourth 2.56 V, etc. This group of adjacent word lines exhibits a well-defined, monotonically-increasing trend of the optimal read threshold. Following the example described above, if in another group of word lines, the optimal read threshold on the first word line is 2.48 V, R/W unit 45 will drive the next adjacent word line with 2.50 V, the third word line with 2.53 V, and so forth following the same upward trend.

In some embodiments, as processor 30 decodes the data pages read from multiple subsets of adjacent word lines, processor 30 assesses the number of bit flips (e.g., decoding errors) over successive data decoding operations from the data stored in the multiple subsets using error correction codes. When processor 30 decodes LSB data pages and identifies that bit flips occurred (referring now to marker 135 in FIG. 2), if processor 30 assesses that the number of LSB bit flips BF10>>BF01, processor 30 instructs R/W unit 45 to increase the read threshold voltage $LSBR_{TH}$ to improve decoding (e.g., reduce bit flip errors) in subsequent read operations. Similarly if BF10<<BF01, then processor 30 decreases the read threshold voltage.

This prediction can assist processor 30 in MSB threshold setting. In order to adjust the two MSB read thresholds $R_{TH1}$ and $R_{TH2}$, processor 30 typically needs the bit flip indications BF10 and BF01 (shown in FIG. 2) separately for each of these read thresholds. If, however, the corresponding LSB page is not available during MSB decoding, processor 30 cannot distinguish between the bit-flip indications. When the corresponding LSB page is available, processor 30 may use it to obtain separate bit flip indications, and thus adjust the two MSB thresholds for the next MSB readout.

If system 10 maintains the same data cycling and retention conditions over a group of memory blocks in NVM 25, the optimal read threshold is nearly the same over the memory blocks. However, these parameters may shift over time. By processor 30 using the cached LSB data and the read threshold voltage tracking as described above, the processor may reduce the probability of having to reacquire the optimal read threshold voltages when re-reading the same group of memory blocks.

Although the embodiments described above mainly address cache eviction for the purpose of MSB threshold setting, the methods and systems described herein can also be used in other applications. Moreover, in the embodiments described above, cache eviction preference was given to pages of high bit significance (e.g., MSB pages) in order to retain more pages of low bit significance (e.g., LSB pages) in the cache memory.

In alternative embodiments, it may be beneficial to give cache eviction preference to pages of low bit significance (e.g., LSB) in order to retain more pages of high bit significance (e.g., MSB) in the cache. Thus, the disclosed techniques can generally give preference in cache eviction to pages of a certain bit significance over pages of a different bit significant.

For example, in some cases a memory block is read in reverse order of word lines and pages. In such cases, it is possible to give cache eviction preference to LSB pages and aim to retain MSB pages. MSB pages that are opportunistically available in the cache memory can be used for performing crosstalk cancellation between adjacent word lines, so as to improve decoding performance.

It will thus be appreciated that the embodiments described above are cited by way of example, and that the present disclosure is not limited to what has been particularly shown and described hereinabove. Rather, the scope of the present disclosure includes both combinations and sub-combinations of the various features described hereinabove, as well as variations and modifications thereof which would occur to persons skilled in the art upon reading the foregoing description and which are not disclosed in the prior art.

Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:

reading memory pages from a non-volatile memory that stores at least first memory pages having a first bit significance and second memory pages having a second bit significance that is different from the first bit significance;

caching at least some of the read memory pages, including a plurality of the first memory pages and a plurality of the second memory pages, in a volatile cache residing in a volatile memory;

assigning eviction preferences to the memory pages cached in the volatile memory, by:

identifying which of the cached memory pages, which reside in the volatile memory, had the first bit significance when they resided in the non-volatile memory, and which of the cached memory pages, which reside in the volatile memory, had the second bit significance when they resided in the non-volatile memory;

and assigning eviction preferences to the cached memory pages, responsively to the respective identified bit significance of the memory pages when they resided in the non-volatile memory;

selecting one or more of the cached memory pages from the plurality of the first memory pages and the plurality of the second memory pages, for eviction from the volatile cache in accordance with the assigned eviction preferences; and evicting the selected memory pages from the volatile cache.

2. The method according to claim 1, wherein the non-volatile memory comprises a 2-bit multi-level cell (MLC) Flash memory, wherein the first memory pages comprise least significant bit (LSB) data pages, and wherein the second memory pages comprise most significant bit (MSB) data pages.

3. The method according to claim 1, wherein the non-volatile memory comprises a triple-level cell (TLC) Flash memory, wherein the first memory pages comprise least significant bit (LSB) data pages or middle significant bit (MSB) data pages, and wherein the second memory pages comprise the middle significant bit data pages or upper significant bit (USB) data pages.

4. The method according to claim 1, wherein caching the memory pages comprises caching information indicative of respective bit significance orders of the cached memory pages, and wherein assigning the eviction preferences is performed based on the cached information.

5. The method according to claim 1, and comprising decoding a given second memory page by:

if the volatile cache caches a given first memory page that was stored in the non-volatile memory in a same group of memory cells as the given second memory page, decoding the given second memory page using the cached given first memory page; and if the volatile cache does not cache the given first memory page, decoding the given second memory page irrespective of the given first memory page.

6. The method according to claim 5, wherein caching the memory pages comprises caching information indicative of respective groups of memory cells of the non-volatile memory from which the cached memory pages were read, and wherein decoding the given second memory page comprises deciding, using the information, whether or not the cache memory caches the given first memory page.

7. The method according to claim 5, wherein decoding the given second memory page comprises distinguishing, using the given first memory page, between at least first and second subsets of the given second memory page that were decoded relative to respective first and second read thresholds.

8. The method according to claim 7, wherein decoding the given second memory page comprises counting first and second error events relating to the first and second read thresholds, respectively, and adjusting the first and second read thresholds responsively to the counted first and second error events.

9. The method according to claim 5, wherein decoding the given second memory page comprises assigning soft decoding metrics to bits of the given second memory page depending on the bits of the given first memory page, and decoding the given second memory page using the soft decoding metrics.

10. An apparatus, comprising:

a volatile cache, which resides in a volatile memory; and a processor, which is configured to:

read memory pages from a non-volatile memory that stores at least first memory pages having a first bit significance and second memory pages having a second bit significance that is different from the first bit significance;

cache at least some of the read memory pages, including a plurality of the first memory pages and a plurality of the second memory pages, in the volatile cache residing in the volatile memory;

assign eviction preferences to the memory pages cached in the volatile memory, by:

identifying which of the cached memory pages, which reside in the volatile memory, had the first bit significance when they resided in the non-volatile memory, and which of the cached memory pages, which reside in the volatile memory, had the second bit significance when they resided in the non-volatile memory;

and assigning eviction preferences to the cached memory pages, responsively to the respective identified bit significance of the memory pages when they resided in the non-volatile memory;

select one or more of the cached memory pages from the plurality of the first memory pages and the plurality of the second memory pages, for eviction from the volatile cache in accordance with the assigned eviction preferences; and evict the selected memory pages from the volatile cache.

11. The apparatus according to claim 10, wherein the non-volatile memory comprises a 2-bit multi-level cell (MLC) Flash memory, wherein the first memory pages comprise least significant bit (LSB) data pages, and wherein the second memory pages comprise most significant bit (MSB) data pages.

12. The apparatus according to claim 10, wherein the non-volatile memory comprises a triple-level cell (TLC) Flash memory, wherein the first memory pages comprise least significant bit (LSB) data pages or middle significant bit (MSB) data pages, and wherein the second memory pages comprise the middle significant bit data pages or upper significant bit (USB) data pages.

13. The apparatus according to claim 10, wherein the processor is configured to cache information indicative of respective bit significance orders of the cached memory pages, and to assign the eviction preferences based on the cached information.

14. The apparatus according to claim 10, wherein the processor is configured to decode a given second memory page by:
- if the volatile cache caches a given first memory page that was stored in the non-volatile memory in a same group of memory cells as the given second memory page, decoding the given second memory page using the cached given first memory page; and
- if the volatile cache does not cache the given first memory page, decoding the given second memory page irrespective of the given first memory page.

15. The apparatus according to claim 14, wherein the processor is configured to cache information indicative of respective groups of memory cells of the non-volatile memory from which the cached memory pages were read, and to decide, using the information, whether or not the cache memory caches the given first memory page.

16. The apparatus according to claim 14, wherein the processor is configured to decode the given second memory page by distinguishing, using the given first memory page, between at least first and second subsets of the given second memory page that were decoded relative to respective first and second read thresholds.

17. The apparatus according to claim 16, wherein the processor is configured to count first and second error events relating to the first and second read thresholds, respectively, and to adjust the first and second read thresholds responsively to the counted first and second error events.

18. The apparatus according to claim 14, wherein the processor is configured to assign soft decoding metrics to bits of the given second memory page depending on the bits of the given first memory page, and to decode the given second memory page using the soft decoding metrics.

19. An apparatus, comprising:
- a non-volatile memory, which is configured to store at least first memory pages having a first bit significance and second memory pages having a second bit significance that is different from the first bit significance;
- a volatile cache, which resides in a volatile memory; and
- a processor, which is configured to:
  - read memory pages from the non-volatile memory;
  - cache at least some of the read memory pages, including a plurality of the first memory pages and a plurality of the second memory pages, in the volatile cache residing in the volatile memory;
  - assign eviction preferences to the memory pages cached in the volatile memory, by:
    - identifying which of the cached memory pages, which reside in the volatile memory, had the first bit significance when they resided in the non-volatile memory, and which of the cached memory pages, which reside in the volatile memory, had the second bit significance when they resided in the non-volatile memory;
    and
    - assigning eviction preferences, to the cached memory pages, responsively to the respective identified bit significance of the memory pages when they resided in the non-volatile memory;
  - select one or more of the cached memory pages from the plurality of the first memory pages and the plurality of the second memory pages, for eviction from the volatile cache in accordance with the assigned eviction preferences; and
  - evict the selected memory pages from the volatile cache.

20. The apparatus according to claim 19, wherein the processor is configured to decode a given second memory page by:
- if the volatile cache caches a given first memory page that was stored in the non-volatile memory in a same group of memory cells as the given second memory page, decoding the given second memory page using the cached given first memory page; and
- if the volatile cache does not cache the given first memory page, decoding the given second memory page irrespective of the given first memory page.

* * * * *